(12) United States Patent
Kim

(10) Patent No.: US 8,297,486 B2
(45) Date of Patent: Oct. 30, 2012

(54) BUMP PRINTING APPARATUS AND METHOD OF CONTROLLING THE SAME

(75) Inventor: Joon Kon Kim, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 478 days.

(21) Appl. No.: 12/588,047

(22) Filed: Oct. 1, 2009

(65) Prior Publication Data

US 2010/0291289 A1 Nov. 18, 2010

(30) Foreign Application Priority Data

May 13, 2009 (KR) .................. 10-2009-0041644

(51) Int. Cl.
*B23K 37/00* (2006.01)
(52) U.S. Cl. ................ 228/13; 228/39; 228/41
(58) Field of Classification Search .......... None
See application file for complete search history.

(56) References Cited

U.S. PATENT DOCUMENTS

| | | | | |
|---|---|---|---|---|
| 4,649,817 A | * | 3/1987 | Smith | 101/129 |
| 5,582,104 A | * | 12/1996 | Best et al. | 101/126 |
| 5,921,462 A | * | 7/1999 | Gordon | 228/191 |
| 6,665,043 B1 | * | 12/2003 | Okuyama et al. | 349/187 |
| 2003/0131742 A1 | * | 7/2003 | Kanda | 101/126 |

FOREIGN PATENT DOCUMENTS

| | | | | |
|---|---|---|---|---|
| GB | 2346584 | A | * | 8/1988 |
| JP | 54-034778 | A | * | 3/1979 |
| JP | 10-284829 | | | 10/1998 |
| JP | 2001-215716 | A | * | 8/2001 |
| JP | 2003-089190 | A | * | 3/2003 |
| KR | 10-2008-0028467 | | | 3/2008 |

OTHER PUBLICATIONS

Korean Office Action issued Jan. 6, 2011 in corresponding Korean Patent Application 10-2009-0041644.

* cited by examiner

*Primary Examiner* — Kiley Stoner

(57) ABSTRACT

There is provided a bump printing apparatus and a method of controlling the same that can increase the printability of solder bumps being printed on a board. The bump printing apparatus may include a printing table onto which a board is mounted; a mask making close contact with the board and printing solder bumps on the board by separating the mask from the board after a printing operation; and air nozzles provided within the printing table and providing air suction to bring the board into close contact with the printing table and spraying air to separate the mask from the board.

5 Claims, 7 Drawing Sheets

BUMP PRINTING APPARATUS AND METHOD OF CONTROLLING THE SAME

CROSS-REFERENCE TO RELATED APPLICATIONS

This application claims the priority of Korean Patent Application No. 10-2009-0041644 filed on May 13, 2009, in the Korean Intellectual Property Office, the disclosure of which is incorporated herein by reference.

BACKGROUND OF THE INVENTION

1. Field of the Invention

The present invention relates to a bump printing apparatus and a method of controlling the same, and more particularly, to a bump printing apparatus and a method of controlling the same that can increase the printability of solder bumps being printed on a board.

2. Description of the Related Art

In general, flip chip bonding, tape automated bonding and wire bonding are being used to interconnect external boards, such as printed circuit boards (PCBs) or wafer level packages (WLPs), to chips.

Among them, flip chip bonding has been widely used to manufacture portable electronic products, since this method increases the number of pads per unit area.

According to flip chip bonding, solder bumps are formed on a wafer in order to appropriately bond chips and external circuitry. Particularly, a technique for manufacturing solder bumps has been developed to form solder bumps having appropriate conductivity, uniform lengths and fine pitches.

According to this solder bump forming technique for flip chip bonding, the characteristics of solder bumps and an application range thereof are determined according to the materials used to form solder bumps. Examples of the solder bump forming technique may include a soldering method of contacting pad electrodes to solder, a screen printing method of forming solder bumps on pad electrodes by screen printing and reflowing the solder bumps, a solder ball reflow method of mounting solder balls onto pad electrodes and reflowing the mounted solder balls, and a plating method of performing solder plating on pad electrodes.

Among them, a screen printing method has been widely used to form solder bumps in that the process of forming solder bumps in this manner is simple, manufacturing costs are low, and bumps of desired metallic material can be formed.

Furthermore, a snap-off method of separating a mask and a board from each other after finishing screen printing includes a mask snap-off method in which a PCB is fixed and a mask is lifted to separate the mask and the PCB and a table snap-off method in which a mask is fixed and a table having a PCB mounted thereon is lowered to separate the mask and the PCB.

However, according to these methods, when the mask and the PCB are forcibly separated from each other, the mask sags and thus the speeds at which the mask and the board are separated vary according to portions. As a result, variations in the shapes of solder bumps and variations in the amounts of solder pastes being printed may occur.

Therefore, bump defects, such as the spreading of solder pastes, short circuits and missing bumps, in which bumps are not formed, occur to reduce the printability of bumps, which may reduce the reliability of printed circuit boards.

SUMMARY OF THE INVENTION

An aspect of the present invention provides a bump printing apparatus and a method of controlling the same that can increase the printability of solder bumps by allowing for the easy withdrawal of solder pastes so as to maintain the shapes of bumps and increase the reliability of a board by preventing the generation of bump defects.

According to an aspect of the present invention, there is provided a bump printing apparatus including: a printing table onto which a board is mounted; a mask making close contact with the board and printing solder bumps on the board by separating the mask from the board after a printing operation; and air nozzles provided within the printing table and providing air suction to bring the board into close contact with the printing table and spraying air to separate the mask from the board.

The bump printing apparatus may further include the air nozzles including a plurality of suction nozzles providing air suction and a plurality of spray nozzles spraying air, the suction nozzles and the spray nozzles arranged along an upper surface of the printing table.

The spray nozzles may generate air pressure between the mask and the board in close contact with each other under vacuum so that the mask and the board are separated from each other.

The spray nozzles may spray air so that the mask is separated from the board while maintaining a horizontal state with respect to the board.

The spray nozzles may be inclined so that air is sprayed in a direction from a central portion of the printing table toward the outside thereof or the inside thereof.

The board may have air holes formed therethrough so that air being sprayed through the air nozzles passes through the board and moves upward from the board.

The bump printing apparatus may further include a control unit controlling the air nozzles.

According to another aspect of the present invention, there is provided a method of controlling a bump printing apparatus, the method including: securing a board having air holes therein to a printing table by vacuum suction using suction nozzles; bring the mask into close contact with the board; printing solder bumps by compressing and moving a solder paste across an upper surface of the mask using a squeegee; spraying air through spray nozzles to separate the mask from the board; and terminating air spraying using the spray nozzles and terminating air suction using the suction nozzles to remove the board.

The securing of the board may further include aligning the board so that the air holes are arranged at locations corresponding to the spray nozzles of the printing table.

The bringing of the mask into close contact with the board may further include providing air suction through the suction nozzles.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1A:
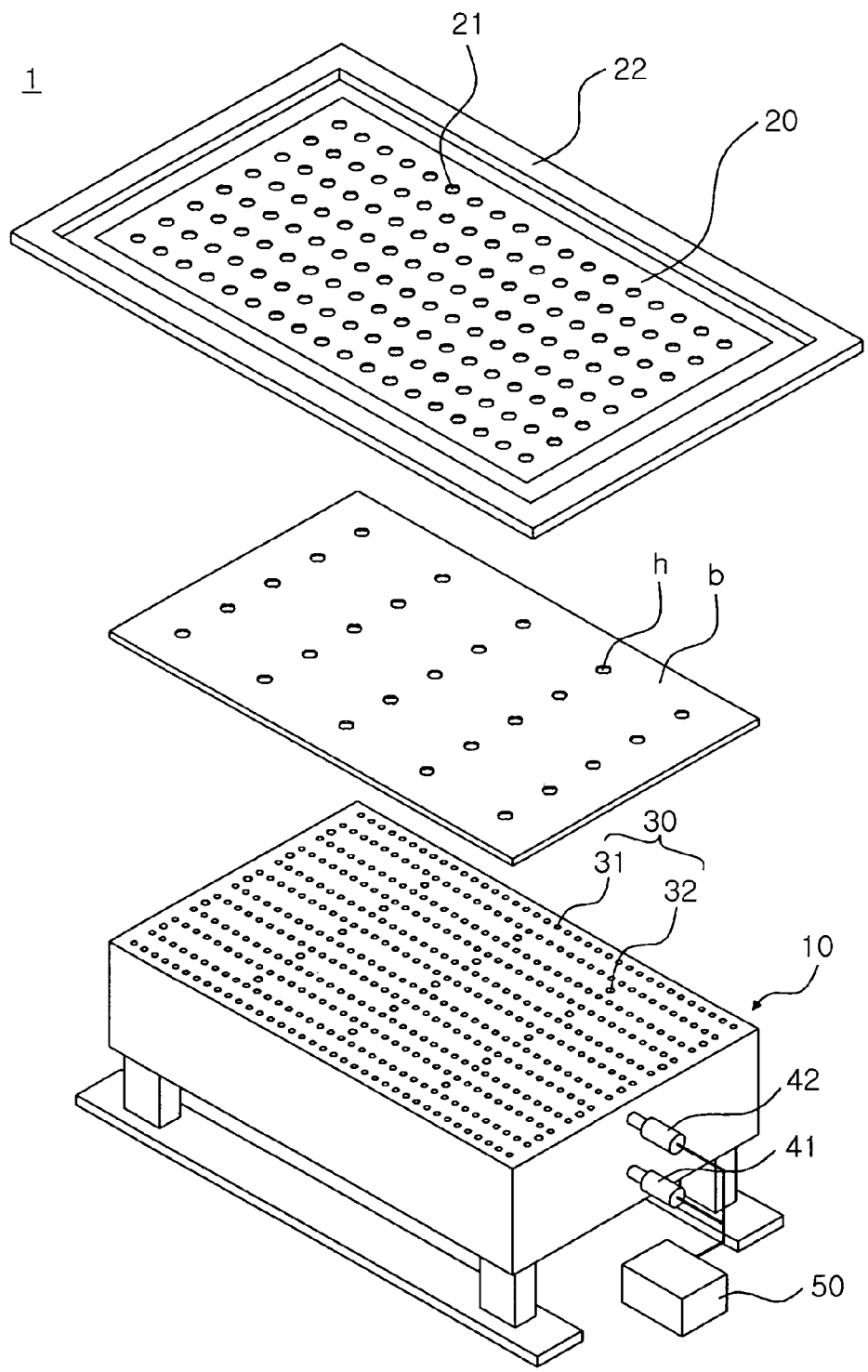
FIG. 1A is a perspective view schematically illustrating a bump printing apparatus according to an exemplary embodiment of the present invention.
Figure 1B:
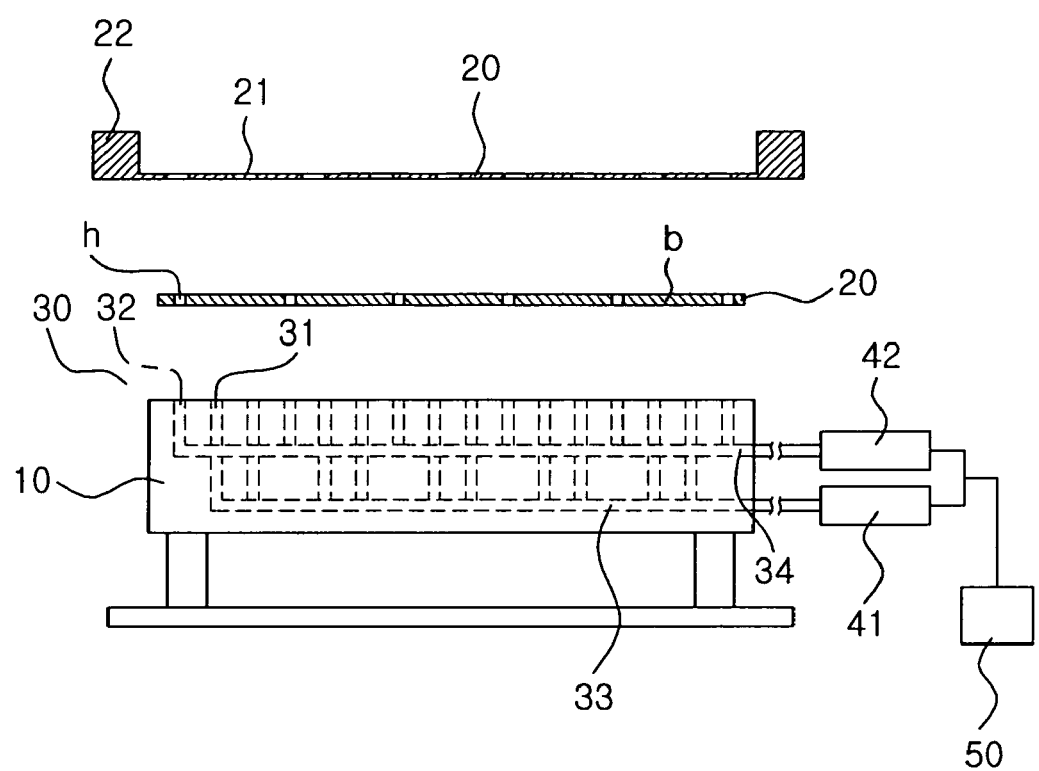
FIG. 1B is a cross-sectional view schematically illustrating the bump printing apparatus, shown in FIG. 1A.
Figure 2:
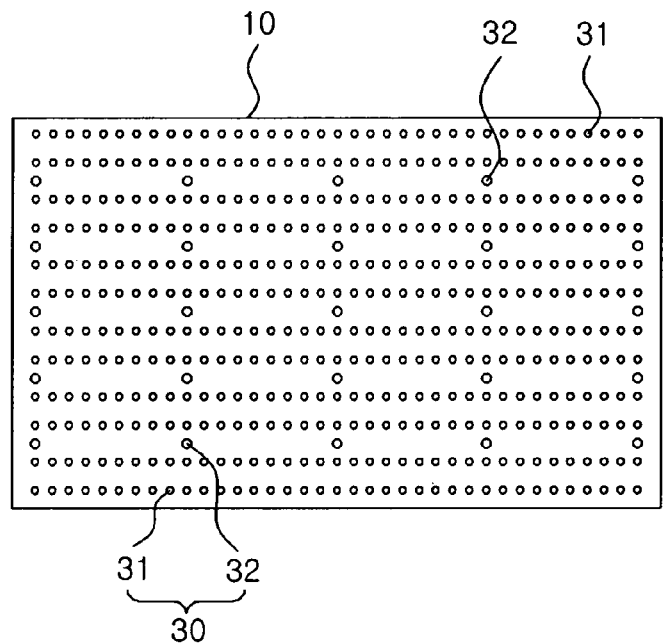
FIG. 2 is a plan view illustrating a printing table including suction nozzles and spray nozzles of the bump printing apparatus, shown in FIGS. 1A and 1B.
Figure 3:
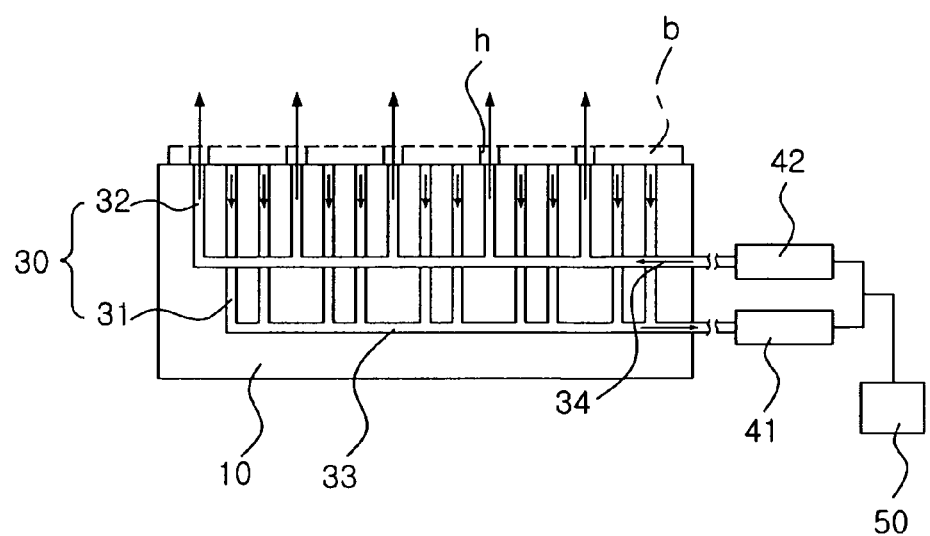
FIG. 3 is a cross-sectional view illustrating the printing table, shown in FIG. 2.

FIG. 1A is a perspective view schematically illustrating a bump printing apparatus according to an exemplary embodiment of the invention. FIG. 1B is a cross-sectional view schematically illustrating the bump printing apparatus shown in FIG. 1A. FIG. 2 is a plan view illustrating a printing table including suction nozzles and spray nozzles of the bump printing apparatus, shown in FIGS. 1A and 1B. FIG. 3 is a cross-sectional view illustrating the printing table, shown in FIG. 2.

Figure 4A:
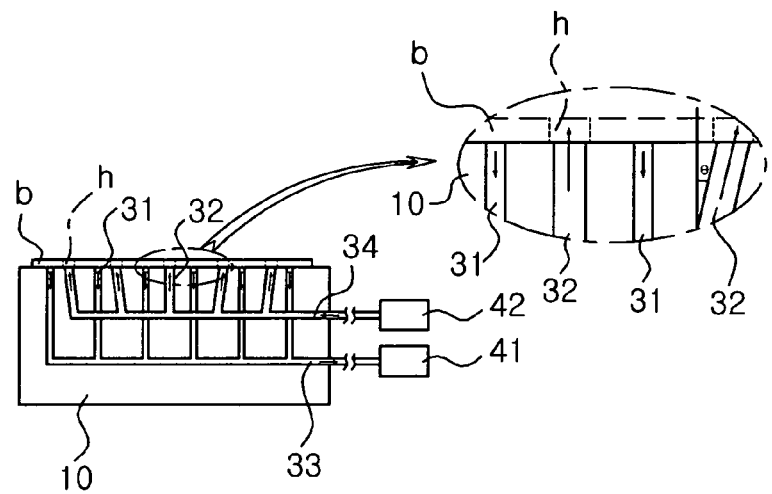
FIG. 4A is a cross-sectional view schematically illustrating another example of the spray nozzles of the printing table, shown in FIG. 3.
Figure 4B:
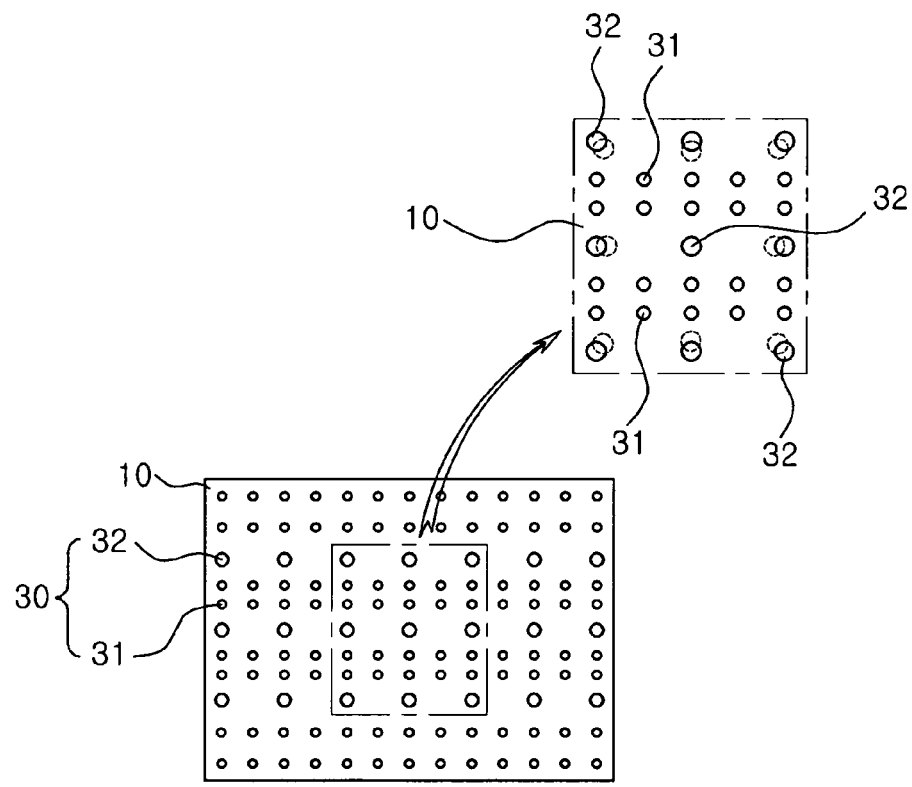
FIG. 4B is a plan view schematically illustrating another example of the spray nozzles of the printing table, shown in FIG. 3.
Figure 5A:
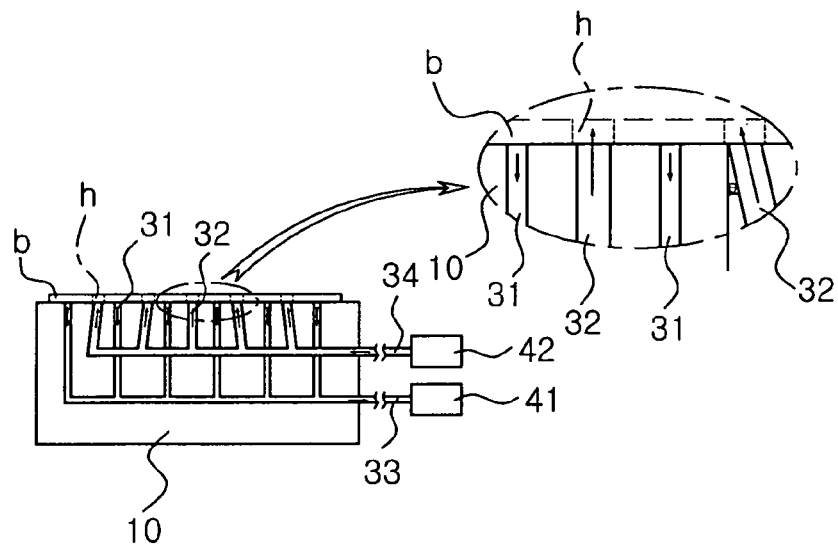
FIG. 5A is a cross-sectional view schematically illustrating another example of the spray nozzles of the printing table, shown in FIG. 3.
Figure 5B:
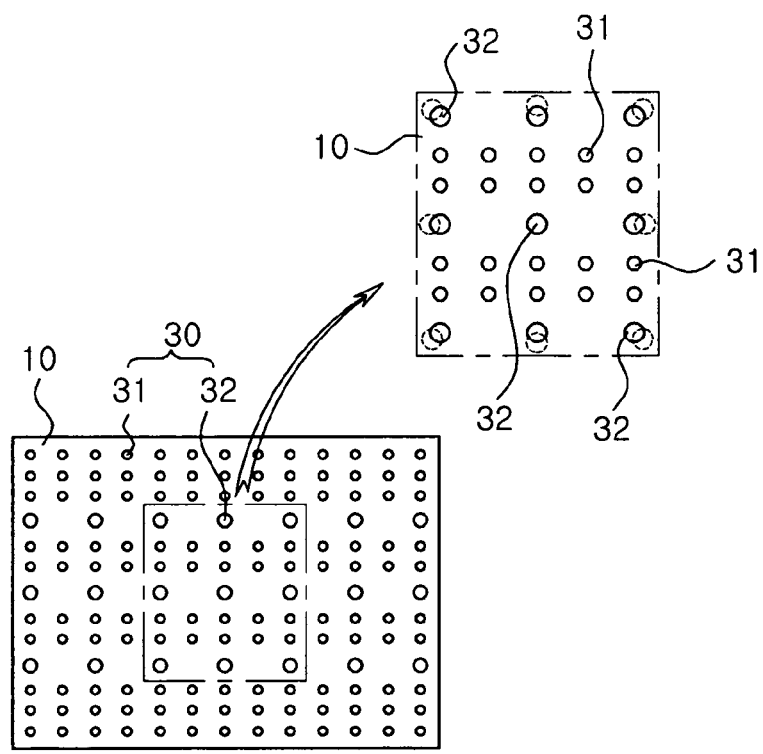
FIG. 5B is a plan view schematically illustrating another example of the spray nozzles of the printing table, shown in FIG. 3.
Figure 6A:
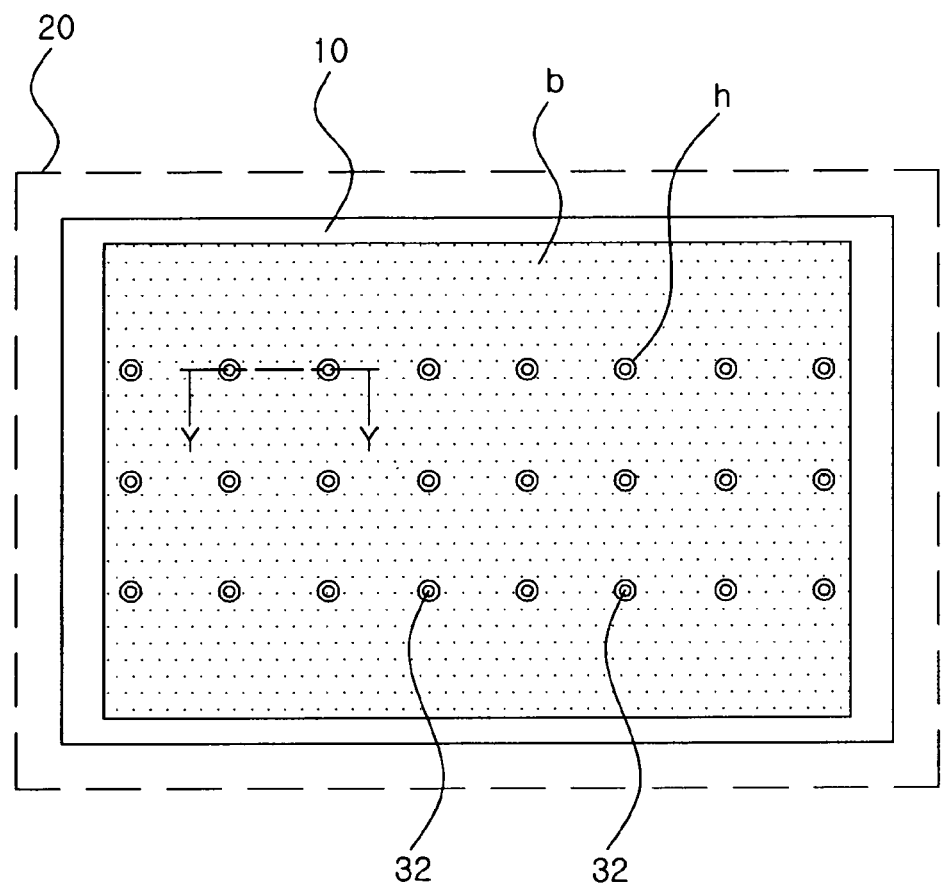
FIG. 6A is a plan view schematically illustrating a state in which a board and a mask are mounted on the printing table, shown in FIGS. 2A and 2B.
Figure 6B:
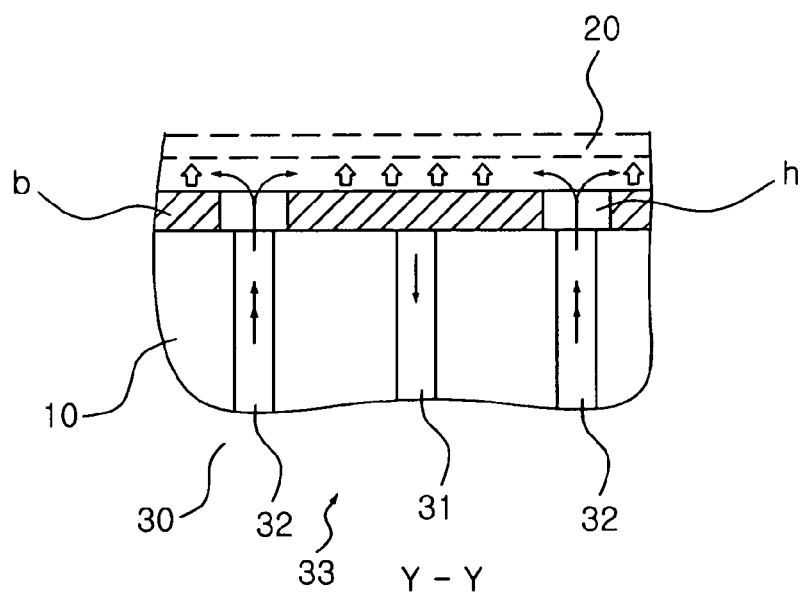
FIG. 6B is an enlarged plan view taken along the line y-y of FIG. 6A.

FIG. 4A is a cross-sectional view schematically illustrating another example of the spray nozzles of the printing table, shown in FIG. 3. FIG. 4B is a plan view schematically illustrating another example of the spray nozzles of the printing table, shown in FIG. 3. FIG. 5A is a cross-sectional view schematically illustrating another example of the spray nozzles of the printing table, shown in FIG. 3. FIG. 5B is a plan view schematically illustrating another example of the spray nozzles of the printing table, shown in FIG. 3. FIG. 6A is a plan view schematically illustrating a state in which a board and a mask are mounted on the printing table, shown in FIGS. 2A and 2B. FIG. 6B is an enlarged plan view taken along the line of FIG. 6A.

Referring to FIGS. 1 through 6, a bump printing apparatus 1 according to this embodiment includes a printing table 10, a mask 20 and air nozzles 30.

The printing table 10 is a jig member that is used to secure a board b to be mounted onto an upper surface thereof so as to perform screen printing to print solder bumps 60.

As shown in FIGS. 1A and 1B through 6A and 6B, the printing table 10 generally has a rectangular shape corresponding to a shape of the board b. However, the present invention is not limited thereto.

As for the board b, general boards, such as a ceramic board and a printed circuit board (PCB), formed of resin materials, including rigid and flexible PCBs, may be used.

Here, a plurality of air holes h are formed through the board b so that air being sprayed through the air nozzles 30 passes through the board b and moves upward from the board b.

The air holes h are formed so that air being sprayed from the printing table 10 separates the mask 20 in close contact with the board b without being interrupted by the board b. A detailed description of the air holes h will be described in detail below.

The mask 20 is provided on an upper surface of the board b that is mounted on the printing table 10. The mask 20 has pattern holes 21, arranged in a predetermined pattern, and is supported by a jig 22.

The mask 20 makes close contact with and is secured to the upper surface of the board b. After a solder paste p is compressed and moved using a squeegee s in order to print the solder bumps 60, the mask 20 is separated from the board b again to thereby form the solder bumps 60 on the board b.

At this time, as a vacuum is substantially created between the mask 20 and the board b, the mask 20 and board b are not misaligned during a screen printing process to thereby accurately print the solder bumps 60 at design positions.

The mask 20 may be a general metal mask. However, the present invention is not limited thereto. A mask of another material may be provided as the mask 20.

The air nozzles 30 are provided within the printing table 10, provide air suction so that the board b makes close contact with the printing table 10 and spray air so that the mask 20 is separated from the board b.

As shown in FIGS. 1A and 1B through FIGS. 6A and 6B, the air nozzles 30 include a plurality of suction nozzles 31 providing air suction, and a plurality of spray nozzles 32 spraying air, which are arranged along the upper surface of the printing table 10.

The suction nozzles 31 provide air suction at constant pressure to thereby secure the board b, mounted on the upper surface of the printing table 10, by vacuum suction.

Meanwhile, the spray nozzles 32 spray air between the mask 20 and the board b and generate air pressure between the mask 20 and the board b in close contact with each other under vacuum to thereby separate the mask 20 and the board b from each other.

In particular, the spray nozzles 32 spray air while adjusting the pressure of air being sprayed so that the mask 20 can be separated from the board b while maintaining the horizontal state.

That is, in order to separate the board b and the mask 20 from each other when finishing the printing process, although the mask 20 sags, the mask 20 is not forcibly separated like the related art, but the mask 20 is separated from the board b while maintaining the horizontal state by air pressure caused by air blowing, so that the solder paste p can be easily withdrawn from the pattern holes to thereby form the solder bumps 60.

Furthermore, as shown in FIGS. 4A and 4B, the spray nozzles 32 may be inclined at a predetermined angle θ so that the spray nozzles 32 can spray air in a radial direction from the center of the printing table 10 toward the outside thereof.

Here, as shown in FIGS. 4A and 4B, while the spray nozzles 32, located at the center portion of the mask 20 that coincides with the center of the mask 20, may be arranged in a vertical direction perpendicular to the upper surface of the printing table 10, the spray nozzles 32 may be inclined at the predetermined angle θ toward the outside of the printing table 10 as the spray nozzles 32 get distant from the central portion. That is, the spray nozzles 32 of the printing table 10 may have a radial shape.

Therefore, although the mask 20 generally sags toward the central portion, air is sprayed in a direction corresponding to the sagging mask 20, which facilitates maintaining the horizontal state of the mask 20.

Further, as shown in FIGS. 5A and 5B, the spray nozzles 32 may be inclined at a predetermined angle θ so that air is sprayed into a conical form toward the central portion of the printing table 10.

Contrary to the above-described radial shape, the spray nozzles 32 are inclined toward the central portion of the printing table 10 as the spray nozzles 32 get distant from the central portion of the printing table 10.

Here, air is sprayed in a direction facing the sagging mask 20 so that air is mainly sprayed onto the most severe sagging portion of the mask 20, so that the horizontal state of the mask 20 can be easily maintained.

The locations of inlets of the spray nozzles 32 that are exposed to the upper surface of the printing table 10 are constant both in the case in which the spray nozzles 32 are arranged in a perpendicular direction to the printing table 10 and the case in which the spray nozzles 32 are inclined at the predetermined angle θ.

The locations of the air holes h provided through the board b correspond to those of the inlets of the spray nozzles 32.

Therefore, even when the board b is mounted onto the printing table 10, since the spray nozzles 32 and the air holes h overlap and communicate with each other, the inlets of the spray nozzles 32 are not blocked by the board b. As a result, air being sprayed through the spray nozzles 32 can pass through the air holes h and move upward from the board b.

While the spray nozzles 32 spray air to separate the mask 20, the spray nozzles 32 provide air suction as the suction nozzles 31 do so that the mask 20 can be brought into closer contact with the board b.

That is, when the solder bumps 60 are printed, the spray nozzles 32 provide air suction as the suction nozzles 31 do to thereby bring the mask 20 into closer contact with the upper surface of the board b. After the process of printing the solder bumps 60 is completed, the spray nozzles 32 spray air to separate the mask 20 from the board b.

As such, when air suction is provided by the spray nozzles 32 to bring the mask 20 into close contact with the board b by vacuum suction, the generation of gaps between the mask 20 and the board b can be prevented.

The suction nozzles 31 and the spray nozzles 32 are connected to pipes 33 and 34, respectively, which do not communicate with each other and separately guide the flow of air. The pipes 33 and 34 are connected to air pumps 41 and 42, respectively, which are provided outside the printing table 10.

The air pumps 41 and 42 are controlled independently of each other so that air suction through the suction nozzles 31 and air suction and spraying through the spray nozzles 32 are performed independently of each other.

The air nozzles 30, which are controlled according to the driving operation of the air pumps 41 and 42, can be more accurately controlled by a control unit 50 that is separately provided.

A method of controlling a bump printing apparatus according to an exemplary embodiment of the invention will be described in detail.

FIGS. 7A through 7E are schematic views illustrating a printing process being performed using a method of controlling a bump printing apparatus according to an exemplary embodiment of the invention.

Figure 7A:
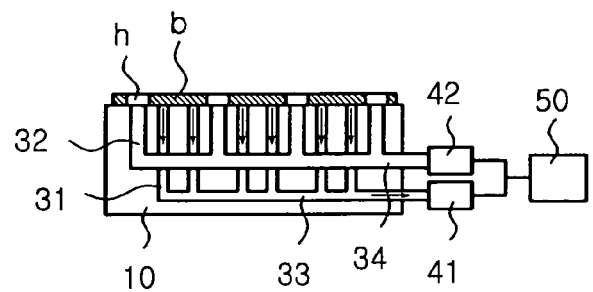
FIGS. 7A through 7E are schematic views illustrating a printing process being performed using a method of controlling a bump printing apparatus according to an exemplary embodiment of the present invention.

Referring to FIG. 7A, the board b for printing the solder bumps 60 is placed on the upper surface of the printing table 10 having the plurality of suction nozzles 31 and the plurality of spray nozzles 32.

The plurality of air holes h are formed in the board b. When the board b is placed on the printing table 10, the board b is arranged so that the air holes h and the spray nozzles 32 overlap and communicate with each other.

The air pump 41, connected to the suction nozzles 31, is then operated to provide air suction through the suction nozzles 31 so that the board b is secured to the printing table 10 by vacuum suction.

Figure 7B:
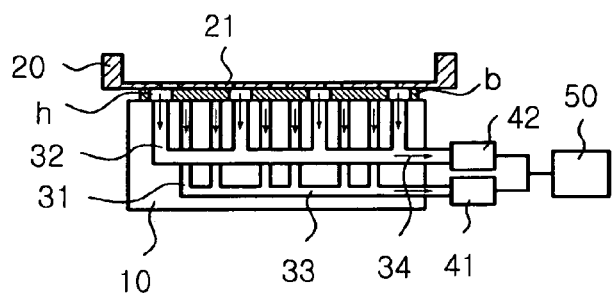

Then, as shown in FIG. 7B, the mask 20, which has the pattern holes 21 arranged in the predetermined pattern and is supported by the jig 22, is brought into close contact with the board b.

Here, the air pump 42, connected to spray nozzles 32, is operated to provide air suction so that the mask 20 can make closer contact with the board b.

Figure 7C:
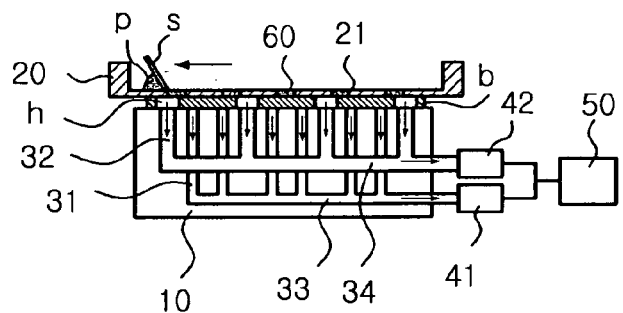

As such, while the board b and the mask 20 are in surface contact with each other, the solder paste p fills in the pattern holes 21 of the mask 20 to perform a printing process by compressing and moving the solder paste p across the upper surface of the mask 20 using the squeegee s, as shown in FIG. 7C.

Figure 7D:
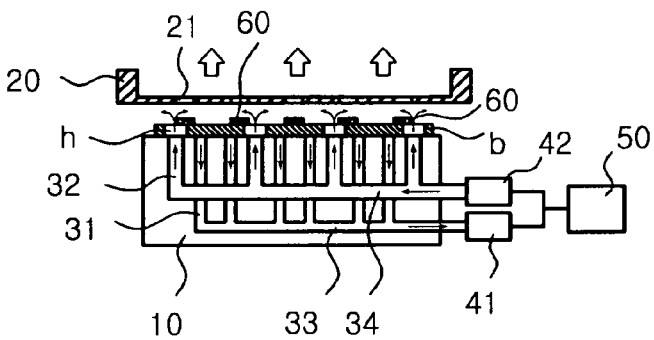

After the printing process is completed, as shown in FIG. 7D, the air pump 42, connected to the spray nozzles 32, is operated to spray air through the spray nozzles 32 so that the mask 20 and the board b are separated from each other.

Here, since the mask nozzles 32 communicate with the air holes h of the board b, air, sprayed through the spray nozzles 32, may pass through the air holes h and move towards the upper surface of the board b.

Therefore, air pressure causing separation of the mask 20 and the board b from each other is generated by air being introduced between the board b and the mask 20.

Here, the suction nozzles 31 continuously provide air suction so as to keep the board b secured to the printing table 10.

Figure 7E:
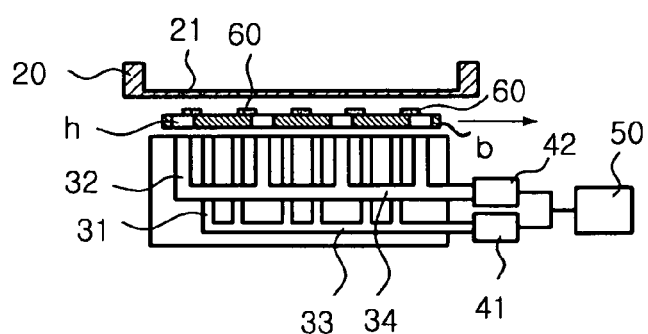

Then, as shown in FIG. 7E, after the mask 20 is separated from the board b, the spraying of air through the spray nozzles 32 is terminated, and air suction through the suction nozzles 31 is terminated, so that the board b is removed from the printing table 10.

A new board b is arranged on the printing table 10, and a printing process continues to be performed on the board b.

The air pumps 41 and 42, connected to the suction nozzles 31 and the spray nozzles 32, respectively, may be controlled independently of each other by the control unit 50. In particular, the control unit 50 controls the pressure of air sprayed through the spray nozzles 32 so as to maintain the horizontal state of the mask 20.

Therefore, elaborate management to separate the sagging mask 20 from the board such as that in the related art is unnecessary.

As such, the mask 20 is separated from the board b by air pressure caused by air blowing while maintaining the horizontal state, so that the solder paste can be easily withdrawn from the pattern holes to easily print the solder bumps 60.

Therefore, defects of the solder bumps 60 can be effectively prevented to increase printability and yield, which may increase the reliability of the board b.

As set forth above, according to exemplary embodiments of the invention, the bump printing apparatus can prevent the generation of defects in solder bumps and allows for the easy withdrawal of solder pastes through pattern holes to form solder bumps to increase printability and yield, thereby increasing the reliability of a circuit board.

Furthermore, elaborate management to separate a mask and a board such as that in the related art is unnecessary, thereby facilitating a manufacturing process and thus improving apparatus productivity, and applicability increases because of a simplified configuration thereof.

While the present invention has been shown and described in connection with the exemplary embodiments, it will be apparent to those skilled in the art that modifications and variations can be made without departing from the spirit and scope of the invention as defined by the appended claims.

What is claimed is:

1. A bump printing apparatus comprising:
    a printing table onto which a board is mounted;
    a mask making close contact with the board and printing solder bumps on the board by separating the mask from the board after a printing operation; and
    air nozzles provided within the printing table and comprising a plurality of suction nozzles providing air suction to bring the board into close contact with the printing table and a plurality of spray nozzles spraying air to separate the mask from the board,
    wherein the suction nozzles are arranged along an upper surface of the printing table and the spray nozzles are arranged between the suction nozzles along an upper surface of the printing table, and
    wherein the board has air holes formed therethrough so that air being sprayed through the air nozzles passes through the board and moves upward from the board.

2. The bump printing apparatus of claim 1, wherein the spray nozzles generate air pressure between the mask and the board in close contact with each other under vacuum so that the mask and the board are separated from each other.

3. The bump printing apparatus of claim 1, wherein the spray nozzles spray air so that the mask is separated from the board while maintaining a horizontal state with respect to the board.

4. The bump printing apparatus of claim 1, wherein the spray nozzles are inclined so that air is sprayed in a direction from a central portion of the printing table toward the outside thereof or the inside thereof.

5. The bump printing apparatus of claim 1, further comprising a control unit controlling the air nozzles.

* * * * *